US007079453B2

(12) United States Patent
Minami et al.

(10) Patent No.: US 7,079,453 B2
(45) Date of Patent: Jul. 18, 2006

(54) TIMEPIECE AND ELECTRONIC APPARATUS WITH BULB-SHAPED SEMICONDUCTOR ELEMENT

(75) Inventors: Shunji Minami, Hamura (JP); Narutoshi Minami, Mitaka (JP); Makoto Sawada, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 128 days.

(21) Appl. No.: 10/602,363

(22) Filed: Jun. 23, 2003

(65) Prior Publication Data

US 2004/0008588 A1 Jan. 15, 2004

(30) Foreign Application Priority Data

Jul. 9, 2002 (JP) ............................ 2002-200579
May 6, 2003 (JP) ............................ 2003-127628

(51) Int. Cl.
*G04B 1/00* (2006.01)
*H01L 25/00* (2006.01)

(52) U.S. Cl. ...................................... 368/205; 136/243

(58) Field of Classification Search ........ 368/203–205; 136/243, 252
See application file for complete search history.

(56) References Cited

U.S. PATENT DOCUMENTS 4,553,851 A * 11/1985 Matsumoto et al. ........ 368/205
5,243,578 A * 9/1993 Mathez ........................ 368/88
6,021,099 A * 2/2000 Aoki et al. ................. 368/205
6,294,822 B1 * 9/2001 Nakata ........................ 257/461
6,355,873 B1 * 3/2002 Ishikawa .................... 136/250
6,372,977 B1 * 4/2002 Miyoshi ...................... 136/246

FOREIGN PATENT DOCUMENTS

JP 3091846 B1 7/2000
JP 2000-292569 A 10/2000
JP 2001-168369 A 6/2001
JP 2001-250971 A 9/2001
JP 2001-267601 A 9/2001
JP 2001-305249 A 10/2001
JP 2002-083980 A 3/2002

OTHER PUBLICATIONS www.dictionary.com definition of cylinder on Feb. 23, 2005.*

* cited by examiner

*Primary Examiner*—Vit W. Miska
(74) *Attorney, Agent, or Firm*—Frishauf, Holtz, Goodman & Chick, P.C.

(57) ABSTRACT

The present invention relates to a timepiece and an electronic apparatus, which comprise a casing, a digital face and a time counting module, both being provided in the casing. A bulb-shaped solar battery element is mounted on the digital face. The bulb-shaped solar battery element is allowed to receive the external light sufficiently to generate the electric power efficiently.

3 Claims, 9 Drawing Sheets

TIMEPIECE AND ELECTRONIC APPARATUS WITH BULB-SHAPED SEMICONDUCTOR ELEMENT

CROSS-REFERENCE TO RELATED APPLICATIONS

This application is based upon and claims the benefit of priority from the prior Japanese Patent Application No. 2002-200579, filed Jul. 9, 2002, the entire contents of which are incorporated herein by reference.

FIELD OF THE INVENTION

The present invention relates to an electronic device, such as a timepiece, a watch, an electronic calculator, and a cellular phone, and more specifically to a timepiece and an electronic apparatus with a bulb-shaped semiconductor element.

BACKGROUND OF THE INVENTION

A wrist watch with a solar battery has been well known. In general, the solar battery built in the conventional solar-battery wrist watch is formed in a sheet form and is arranged on a reverse side of a watch face, which is made of a light transmitting material.

In the conventional solar-battery wrist watch, however, there are many limitations to decoration to be made on the watch face of a light transmitting material, because it is necessary in the solar-battery watch to secure a surface on the sheet-shaped solar battery wide enough to receive light. Therefore, it has been noticed that the conventional solar-battery watch is behind in an external view and design, since attractive decoration is hardly made on the watch face because of the limited space on the watch face.

It is an aspect of the present invention to provide a timepiece having the solar battery that is more effective in a light acceptance than the conventional battery, or a timepiece which is more attractive in its external view and design with various decorations on its dial face.

It is another aspect of the present invention to provide a timepiece and an electronic apparatus with the solar battery that generates energy sufficiently without giving limitations on its indication area.

According to an aspect of the present invention, there is provided a timepiece which comprises a casing, a digital face provided in the casing, a time counting module provided in the casing; and a bulb-shaped semiconductor element mounted on the digital face for supplying driving power to the time counting module.

Since the bulb-shaped semiconductor element mounted on the digital face is formed in a bulb shape, the semiconductor element is low in light directivity so that it can receive direct light, reflected light, and/or scattered light from every direction, generating electricity efficiently. The conventional solar battery of a sheet type needs a wide surface for receiving light, restricting a space for decoration on the watch face. On the contrary, since the solar battery used in the present invention has a unique shape such as a bulb-shape, it can be arranged on a recess or a projecting portion or a curved portion of the casing, which allows to decorate the timepiece using the bulb-shaped semiconductor element being arranged on the recess or projecting portion or the curved portion of the casing. Therefore, according to the present invention timepieces which are more attractive in their design and external view are available.

Further, according to another aspect of the invention, there is provided a time piece which comprises a casing, a display section provided in the casing, a protection glass of a light transmittance nature mounted on the casing so as to face the display section: and a solar battery disposed so as to face a peripheral edge of the protection glass.

When the timepiece according to the invention is exposed to the external light, a part of the external light transmits through the protection glass, and reaches the display section, allowing a user to see the display section clearly. In addition, the part of the external light being guided along the protection glass is emitted from the edge of the protection glass against the solar battery. In other words, the battery can efficiently receive the external light taken in through a whole surface of the protection glass and generates electricity. Further the batteries are arranged in the vicinity of the peripheral edge of the protection glass, so that this arrangement of the batteries does not give any restriction to the display section mounted within the casing.

According to still another aspect of the invention, there is provided a timepiece which comprises a casing, a window section provided to the casing, a display member of a light transmittance nature provided in the casing so as to face the window section: and a solar battery arranged so as to face a peripheral edge of the display member.

When the timepiece is exposed to the external light, the external light is allowed to transmit through the window section to illuminate the display member for recognition by a user. A part of the light illuminating the display member is guided in the display member toward the peripheral edge to irradiate the solar battery. The external light is received through a whole surface of the display member and transmitted to the solar battery, allowing the solar battery to generate the electric power sufficiently. The solar battery is disposed to face the peripheral edge of the display member, so that the display member receives no restriction.

BRIEF DESCRIPTION OF THE DRAWINGS

FIG. 2A is a plane view illustrating a watch face or a digital face and a casing of the wrist watch;

FIG. 2B is a cross-sectional view of the wrist watch;

FIG. 2C is an enlarged view illustrating bulb-shaped solar batteries mounted on the wrist watch;

FIG. 3A is a plane view illustrating a watch face or a digital face and a casing of the wrist watch;

FIG. 3B is a cross-sectional view of the wrist watch;

FIG. 3C and FIG. 3D are enlarged views illustrating bulb-shaped solar batteries mounted on the wrist watch;

FIG. 4A is a plane view illustrating a watch face or digital face and a casing of the wrist watch;

FIG. 4B is a cross-sectional view of the wrist watch;

FIG. 4C is an enlarged view illustrating bulb-shaped solar batteries mounted on the wrist watch;

FIG. 5A is a plane view illustrating a watch face or digital face and a casing of the wrist watch;

FIG. 5B is a cross-sectional view of the wrist watch;

FIG. 5C and FIG. 5D are enlarged views illustrating bulb-shaped solar batteries mounted on the wrist watch;

DETAILED DESCRIPTION OF THE PREFERRED EMBODIMENTS

Now, embodiments of the present invention will be described in details with reference to FIG. 1 through FIG. 11.

Figure 6:
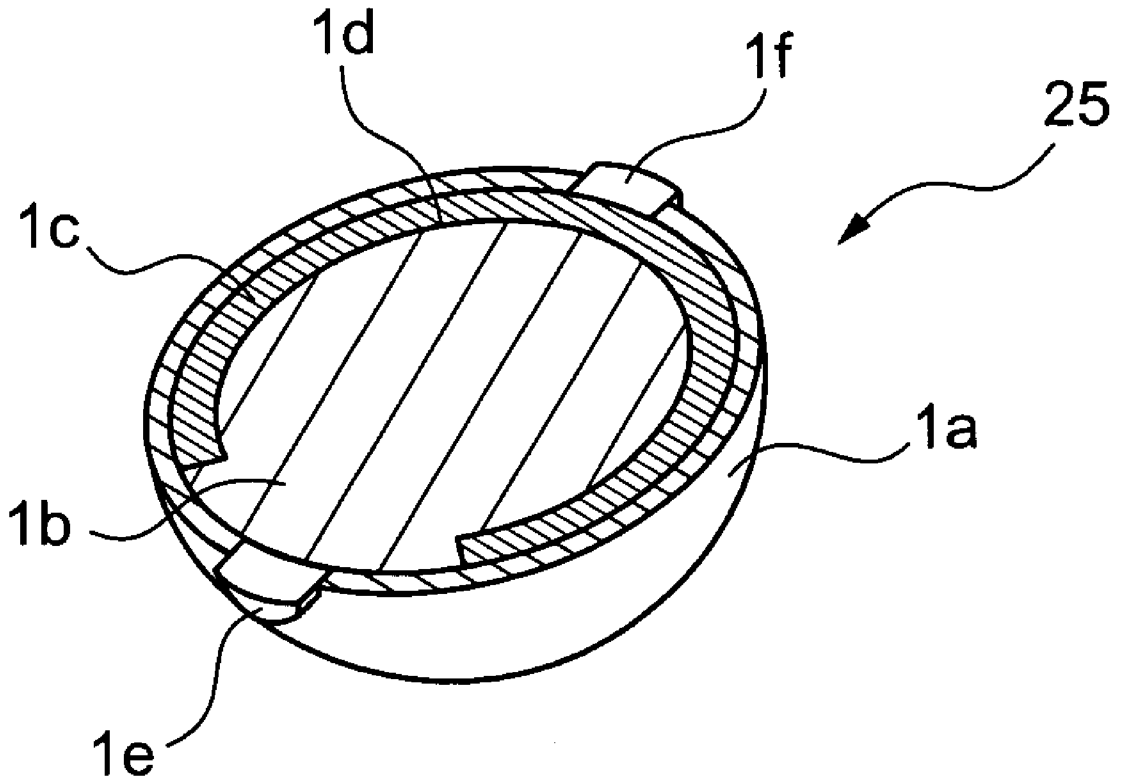
FIG. 6 is a partial cross-sectional view illustrating a sample of bulb-shaped solar batteries used in the invention.

Prior to a detailed explanation of the embodiments, a bulb-shaped solar battery used in the present invention will be described in details. As shown in FIG. 6, a bulb-shaped solar battery element 25 is a bulb-shaped semiconductor, which comprises a silicon single crystal of a diameter 1 to 2 millimeters, covered with an anti-reflection film 1*a*. The silicon single crystal has a p-type bulb-shape silicon block 1*b*, an n-type diffusion layer 1*c*, and a pair of electrodes, a positive electrode 1*e* and a negative electrode 1*f*. The n-type diffusion layer 1*c* covers most of an external surface of the p-type bulb-shaped silicon block 1*b*. The positive electrode 1*e* and the negative electrode 1*f* are disposed opposite and are connected to the p-type bulb-shaped silicon block 1*b* and to the n-type diffusion layer 1*c*, respectively. Optical-electro motive force is generated when a p-n junction 1*d* formed at a boundary between the P-type bulb-shape silicon block 1*b* and the n-type diffusion layer 1*c* and the neighborhood materials receive the light. The bulb-shaped solar battery element 25 of the above mentioned structure has a low directional characteristic with respect to the light, and can efficiently receive direct, reflected, and/or scattered light from every direction.

In each of a first embodiment through a fourth embodiment to be described below, the bulb-shaped solar battery element 25 of the structure set forth above is built in an analog-type wrist watch 10 (timepiece).

First Embodiment

Figure 1:
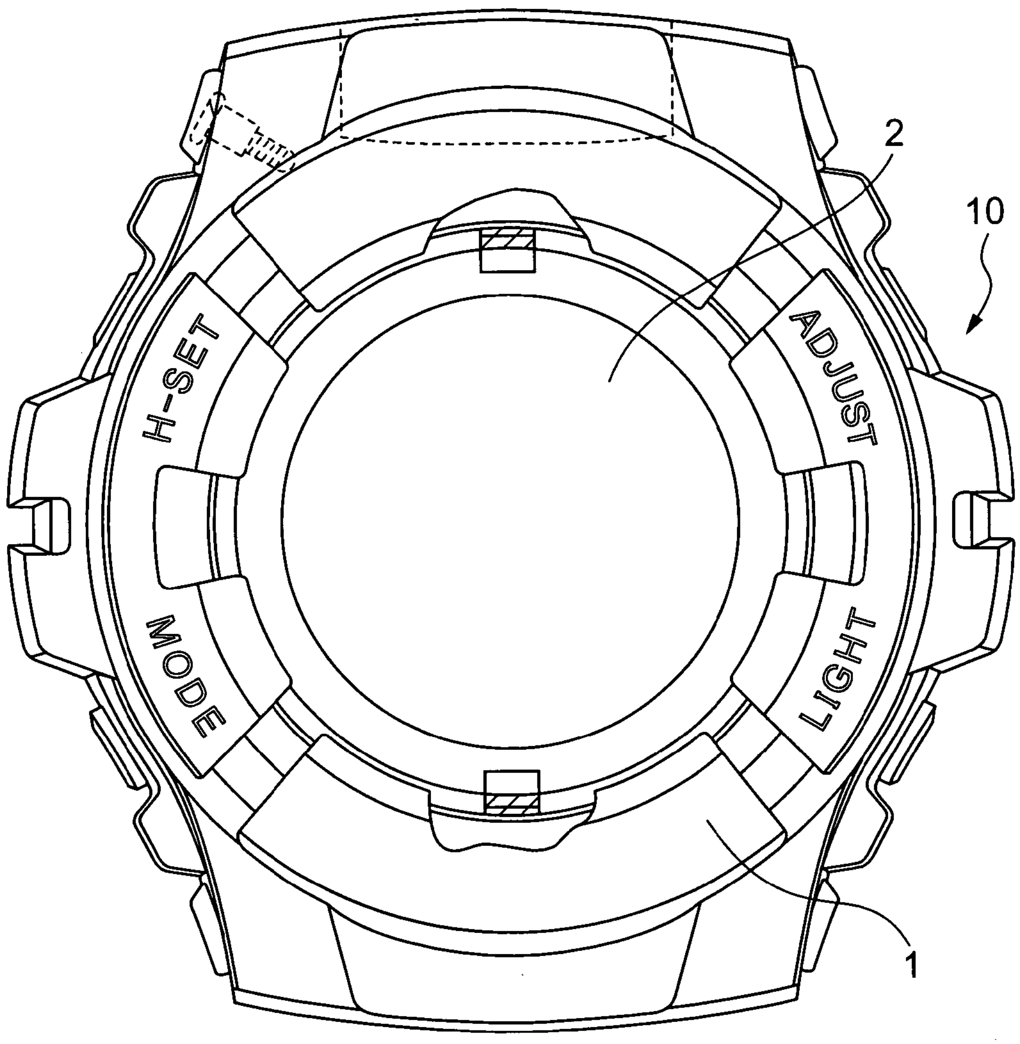
FIG. 1 is a plane view of a wrist watch using an embodiment of the present invention.
Figure 2A:
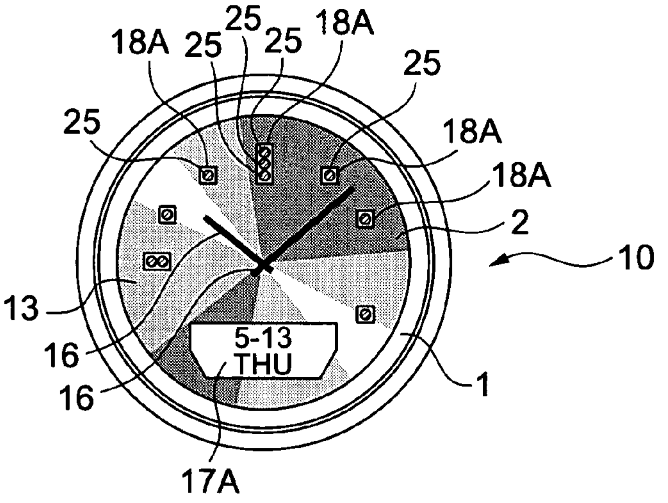
FIGS. 2A through FIG. 2C are views illustrating by way of sample a wrist watch with bulb-shaped solar batteries built therein.
Figure 2B:
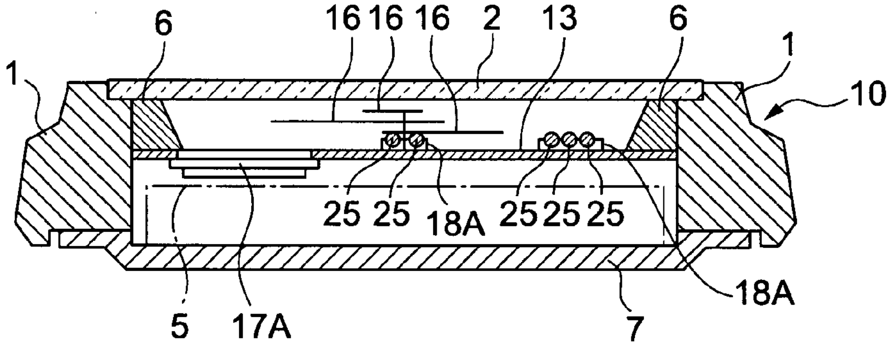

In the first embodiment as shown in FIG. 2A and FIG. 2B, the analog-type wrist watch 10 comprises, a casing 1, a disk-shaped rear cover 7, which covers the casing 1 from a bottom side of the casing 1, a disk-shaped light-transmitting watch glass 2, which covers the casing 1 from a top side of the casing 1, a disk-shaped watch face 13 supported within the casing 1, a corner member 6 disposed between the watch face 13 and the watch glass 2, hands or pointers 16 arranged on a top surface of the watch face 13, a liquid crystal display panel 17A provided in the top surface of the watch face 13, which indicates a date and a day of the week, and a time counting module 5 driven by electricity supplied from the bulb-shaped solar battery element 25.

Figure 2C:
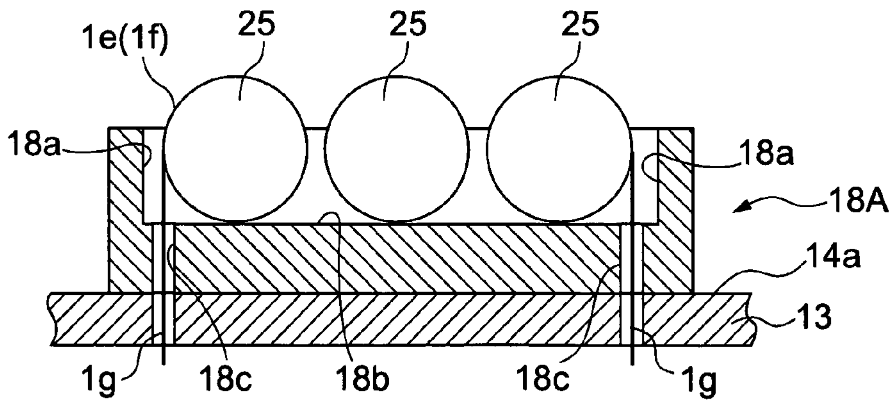

As shown in FIG. 2A, there are provided battery receiving box-like members 18A at a portion defined between a location indicating one o'clock and a location indicating four o'clock on a top surface 14*a* of the watch face 13 and at a portion defined between a location indicating eight o'clock and a location indicating twelve o'clock. The battery receiving box-like member 18A has side walls 18*a* and a bottom plate 18*b*, both being subjected to a light-reflection process, and receives the bulb-shaped solar battery elements 25, as shown in FIG. 2C. It is proposed that during the light reflection process, the side walls 18*a* and the bottom plate 18*b* of the box-like member 18A are subjected to a surface treatment so as to have a surface configuration of light reflection, or to be attached with a sheet of light reflection on their surface.

The box-like member 18A is formed with through holes 18*c*, through which terminals 1*g* connected to the positive electrode 1*e* and the negative electrode 1*f* of the bulb-shaped solar battery element 25 penetrate, as shown in FIG. 2C. The terminals 1*g* penetrating through the through holes 18*c* are connected to a printed board (not shown) to supply energy to drive the time counting module 5.

The present embodiment of the invention will bring advantages set forth below:

(1) Since the bulb-shaped solar battery element 25 has a spherical appearance and is low in the directional characteristic with respect to the light, it can receive direct, reflected, and/or scattered light from every direction, generating electricity efficiently. The conventional solar battery of a sheet type requires a wide light-receiving surface to generate electricity sufficiently, restricting a space for decorations on the watch face or the digital face 13. On the contrary, the bulb-shaped solar battery 25 in the present embodiment has a unique shape such as a bulb-shape, and it can be mounted on a recess or projecting portion or a curved portion of the casing. Therefore, the timepiece can be decorated with the bulb-shaped semiconductor elements being arranged on the recess or projecting portion or the curved portion of the casing. As a result, according to the present invention, the timepieces which are more attractive in their design and external view are available.

(2) Since the bulb-shaped solar battery element 25 is arranged on the surface of the watch face 13, any kind of materials can be used for the watch face. Further, the bulb-shaped solar battery element 25 itself is used to decorate the watch face 13.

(3) Incident light to the box-like member 18A is reflected on its side and bottom plate 18*a*, 18*b* toward the bulb-shaped solar battery element 25 to be received thereby. Therefore, the bulb-shaped solar battery element 25 can efficiently receive light to generate electricity.

Second Embodiment

Referring to FIG. 3A through FIG. 3D, a second embodiment of the invention will be described. In the second embodiment, the bulb-shaped solar battery element 25 is mounted on a wrist watch 10 of a structure similar to the wrist watch of the first embodiment. Like reference numerals will be used in the second embodiment to refer to like or corresponding elements in the first embodiment, and the detailed description thereof will be omitted.

Figure 3A:
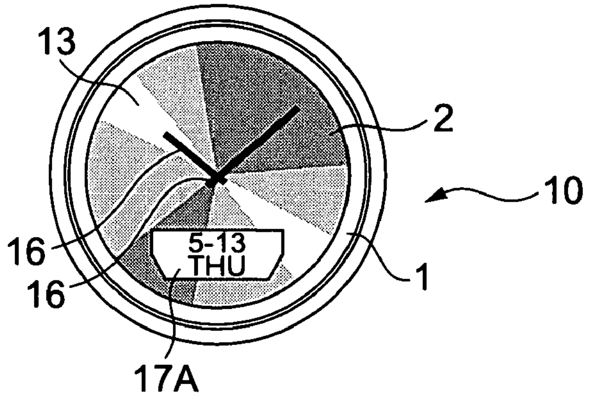
FIGS. 3A through FIG. 3D are views illustrating another example of wrist watches with bulb-shaped solar batteries built therein.
Figure 3B:
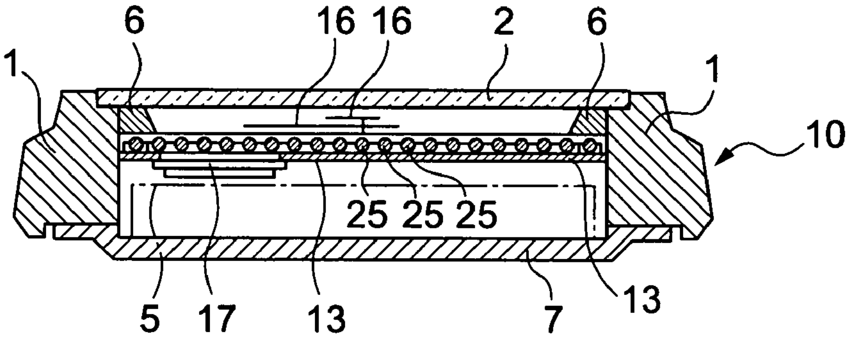

As shown in FIG. 3A and FIG. 3B, the corner member 6 is provided in the casing 1 so as to leave a space between the watch face 13 and the corner member 6 itself, and the bulb-shaped solar battery element 25 is received in the space that is defined by a rear surface 15*a* of the corner member 6, a top surface 14*a* of the watch face 13, and an inner surface 11*c* of the casing 1. The rear surface 15*a* of the corner member 6 and the top surface 14*a* of the watch face each form a non light-transmittance plane or a semi light-transmittance and light reflection plane.

The corner member 6 and the watch face 13 are subjected to a deposition process to form the non light-transmittance plane or the semi light-transmittance and light reflection plane on its top and rear surface 14*a*, 15*a*, respectively. In other words, material such as silver, aluminum, silicon are deposited against a surface of a transparent base material plate to form a thin light-reflection film thereon. The thin film formed on the rear surface 15*a* of the corner member 6 and the top surface 14*a* of the watch face 13 allow a part of the incident light to pass through them, when such thin film has a certain thickness.

Figure 3C:
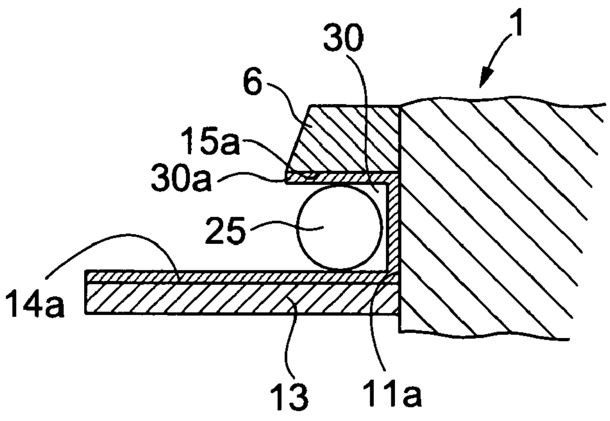
Figure 3D:
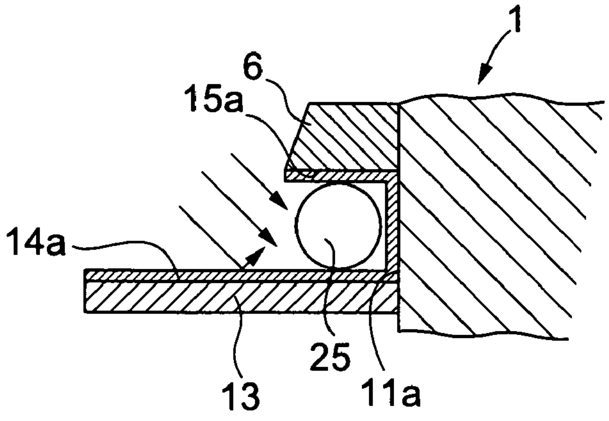

In FIG. 3C and FIG. 3D, a recess 30 defined by the rear surface 15*a* of the corner member 6, the top surface 14*a* of the watch face 13, and the inner surface 11*c* of the casing 1 is provided with a light-reflection layer 30*a* on its internal surface. In the embodiment, a light reflection film may be attached on the internal surface of the recess 30.

In addition to an advantage substantially similar to the advantage (1) brought by the first embodiment, the following advantages will be obtained by the second embodiment.

(4) The corner member 6 having the non or semi light-transmittance plane can hide the bulb-shaped solar battery element 25 mounted on the surface 14*a* of the watch face 13, and therefore a wrist watch of an improved design will be available.

(5) Since the recess 30 defined by the rear surface 15*a* of the corner member 6, the top surface 14*a* of the watch face 13, and the inner surface 11*c* of the casing 1 has a light-reflection layer 30*a* on its internal surface, the incident light is reflected on the internal surface of the recess 30 toward the bulb-shaped solar battery element 25. As a result, the bulb-shaped solar battery element 25 can receive light more efficiently.

(6) When the corner member 6 is made of a semi light-transmittance and light-reflection material, the corner member 6 allows a part of the incident light to pass through it toward the bulb-shaped solar battery element 25. As a result, the bulb-shaped solar battery element 25 can receive light more efficiently.

Third Embodiment

Figure 4A:
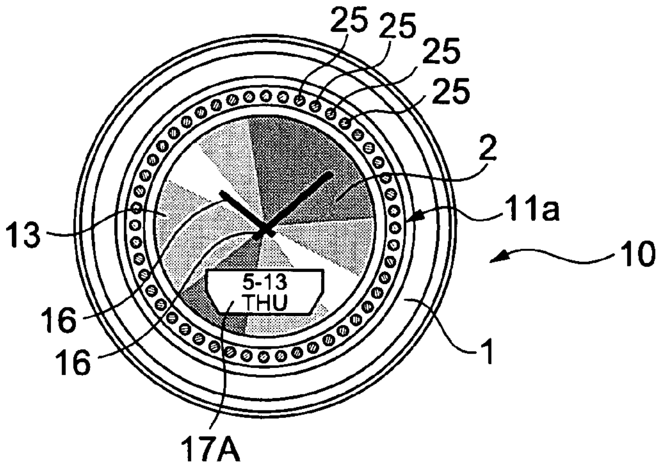
FIGS. 4A through FIG. 4C are views illustrating still another sample of wrist watches with bulb-shaped solar batteries built therein.
Figure 4B:
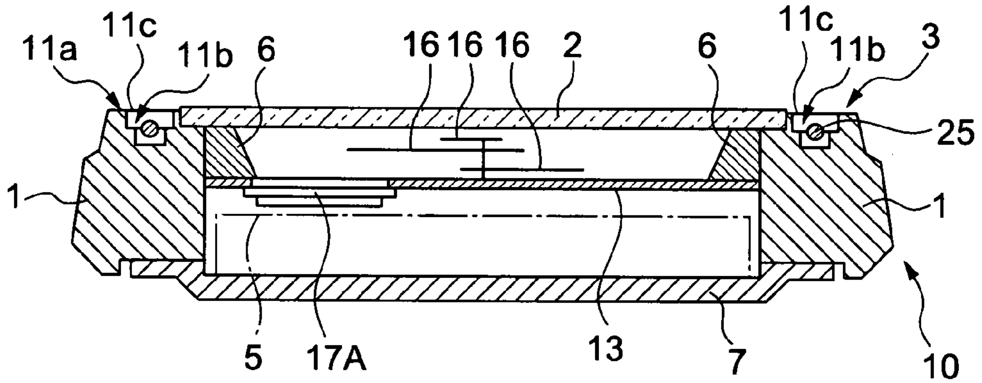
Figure 4C:
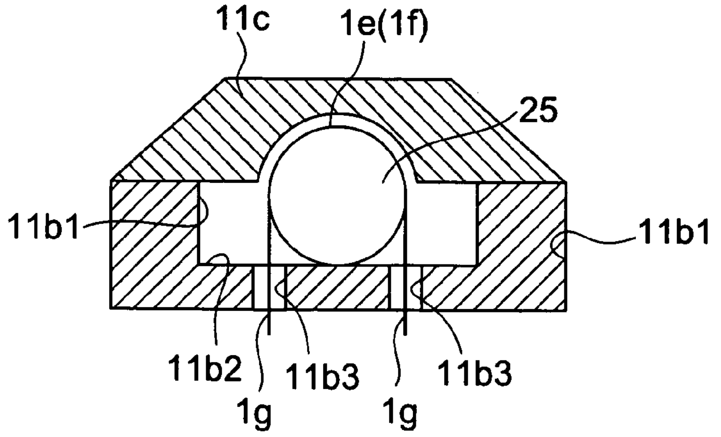

Referring to FIG. 4A through FIG. 4C, a third embodiment of the invention will be described. In the third embodiment, the bulb-shaped solar battery element 25 is mounted on a wrist watch 10 of a structure similar to the wrist watch of the first embodiment. Like reference numerals will be used in the third embodiment to refer to like or corresponding elements in the first embodiment, and the detailed description thereof will be omitted.

In the forth embodiment, a bezel 3 of the casing 1 is formed with a groove 11*b*, where the bulb-shaped solar battery element 25 is received therein, as shown in FIG. 4A and FIG. 4B. The groove 11*b* is provided with a cover 11*c* of a light-transmittance member.

In FIG. 4C, the groove 11*b* is provided with a light-reflection layer on its side walls 11*b*1 and bottom 11*b*2. In the embodiment, the side walls 11*b*1 and the bottom 11*b*2 of the groove 11*b* may be processed so as to have figuration suitable for reflecting the light or may be attached with a light reflecting film thereon.

There are provided through holes 11*b*3 in the bottom 11*b*2 as shown in FIG. 4C. Terminals 1*g*, which are connected to the positive electrode 1*e* and the negative electrode 1*f* of the bulb-shaped solar battery element 25 respectively, penetrate through these through holes 11*b*3 to be connected to the printed circuit board (not shown) to supply energy to drive the time counting module 5.

In addition to the advantage substantially similar to the advantage (1) brought by the first embodiment, the following advantages will be obtained by the third embodiment.

(7) A wrist watch is made available which is decorated using the bulb-shaped solar battery elements 25 mounted in the bezel 3 on the casing 1. The bulb-shaped solar battery element 25 can be easily mounted on the bezel 3 because of its unique figure.

(8) The incident light onto the groove 11*b* reflect on its side walls 11*b*1 and bottom 11*b*2 toward the bulb-shaped solar battery elements 25 received in the groove 11*b*. As a result, the bulb-shaped solar battery elements 25 is allowed to receive the light more efficiently.

Fourth Embodiment

Referring to FIGS. 5A through FIG. 5D, a fourth embodiment of the invention will be described. In the fourth embodiment, the bulb-shaped solar battery element 25 is mounted on a wrist watch 10 of a structure similar to the wrist watch of the first embodiment. Like reference numerals will be used in the third embodiment to refer to like or corresponding elements in the first embodiment, and the detailed description thereof will be omitted.

Figure 5A:
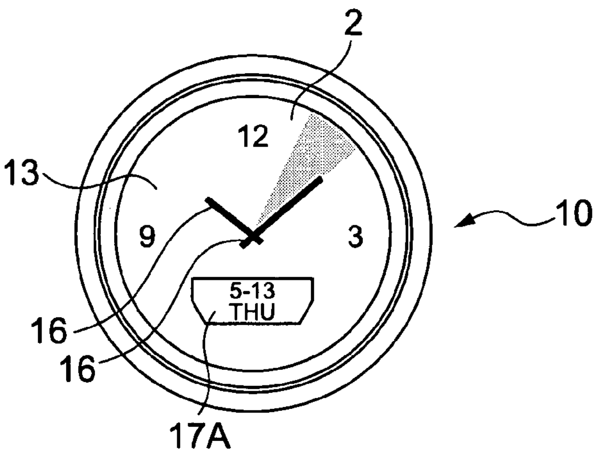
FIG. 5A through FIG. 5D are views illustrating yet another example of wrist watches with bulb-shaped solar batteries built therein.
Figure 5B:
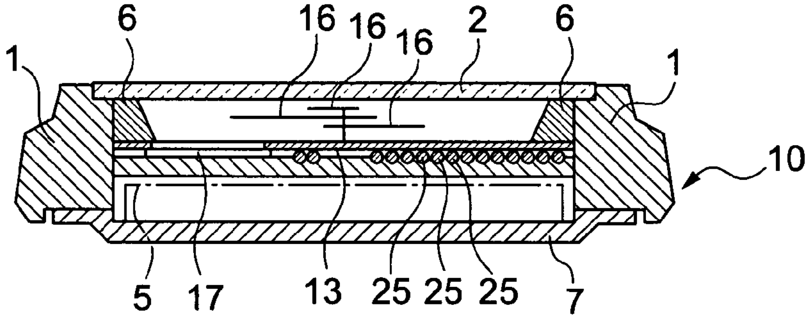

In the fourth embodiment, a watch face 13 is made of a light transmittance material. As shown in FIG. 5A and FIG. 5B, there is provided beneath the watch face 13 a supporting plate 19A for supporting the bulb-shaped solar battery elements 25. The bulb-shaped solar battery elements 25 are arranged between the rear surface 14*b* of the watch face 13 and a top surface 19*a* of the supporting plate 19A.

Figure 5C:
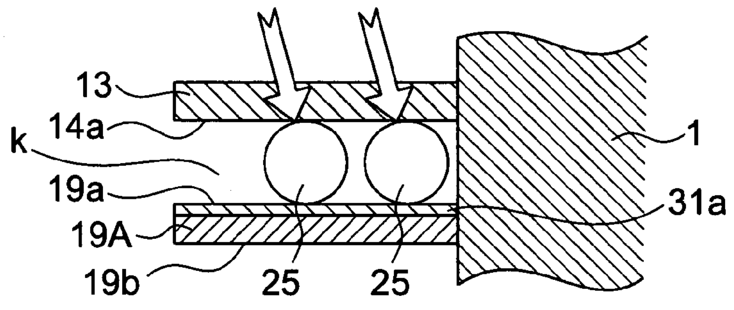

A light reflecting layer 31*a* is provided on the top surface 19*a* of the supporting plate 19A, as shown in FIG. 5C. In the embodiment, the top surface 19*a* of the light reflecting layer 31*a* may be processed so as to have figuration suitable for reflecting the light or may be attached with a light reflecting film thereon.

Figure 5D:
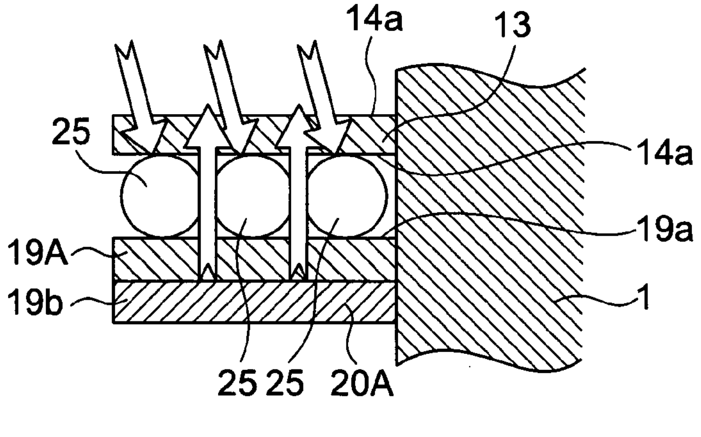

As shown in FIG. 5D, the supporting plate 19A is made of a semi light-transmittance and light-reflection member, and an electro-luminescence element 20A may be provided on a rear surface of the supporting plate 19A, which element 20A is driven and emits light by a current for driving the time counting module 5.

In the embodiment, the supporting plate 19A of a transparent base material is subjected to a deposition process to form a light reflection film on its surface. In other words, material such as silver, aluminum, silicon is deposited against the surface of the transparent base material plate to form a thin light-reflection film thereon. The thin film of a certain thickness formed on the transparent base material plate allows a part of the incident light to pass through.

The electro-luminescence element 20A emits light under the electro-magnetic field, which is generated by the current for driving the time counting module 5.

In addition to an advantage substantially similar to the advantage (1) brought by the first embodiment, the following advantages will be obtained by the fourth embodiment.

(9) In the embodiment, a lot of bulb-shaped solar battery elements 25 can be installed in a comparatively wide space (k) defined between the rear surface 14*b* of the watch face 13 of a transparent material and the top surface 19*a* of the supporting plate 19A provided beneath the watch face 14, and therefore sufficient electric power can be supplied to the wrist watch from these plural battery elements 25. If the watch face 13 is made of a semi light transmittance and light reflection material, the bulb-shaped solar battery elements 25 mounted beneath the watch face are hidden to allow an improved design of the wrist watch 10.

(10) The incident light to the supporting plate 19A is reflected on its top surface 19*a* toward the bulb-shaped solar battery element 25 to be received thereby. Therefore, the bulb-shaped solar battery element 25 can efficiently receive the light to generate electricity.

(11) A part of the light emitted by the electro-luminescence element 20A is allowed to pass through the supporting plate 19A toward the bulb-shaped solar battery element 25. Receiving the light from the electro-luminescence element 20A, the bulb-shaped solar battery element 25 generates the electricity more efficiently.

The invention has been described in detail with particular reference to certain preferred embodiments thereof, but it will be understood that variations and modifications can be effected within the spirit and scope of the invention. For instance, in addition to the timepiece including the wrist watch, the present invention may be applied to electronic devices such as a cellular phone, a personal digital assistant, and a personal computer, automobile, and accessories.

As shown in FIG. 1 through FIG. 4C, the wrist watch 10 according to one embodiment of the present invention is characterized in that the wrist watch comprises the casing 10, the watch face 13 and the time counting module 13 being provided in the casing 10, and the bulb-shaped solar battery element 25 mounted on the watch face 13 for driving the time counting module 13. In the embodiment, since the bulb-shaped solar battery element 25 mounted on the watch face 13 is formed in a unique configuration such as a bulb-shape, the element 25 is low in a directional characteristic and can receive the direct, reflected and/or scattered light from every direction to efficiently generate the electricity. On the contrary to a solar battery of a sheet type using a wide space for receiving the light, the bulb-shaped solar battery element requires no wide space for receiving the light. Therefore, in a timepiece using the bulb-shaped solar battery element, a rather wide space can be used for its decoration. The bulb-shaped solar battery element may be mounted on a recess or projecting portion or a curved portion of the casing without any difficulty, allowing to decorate the wrist watch using the bulb-shaped semiconductor element being arranged on the recess or projecting portion or the curved portion of the casing. Therefore, according to the present invention the timepiece which is more attractive in its design and external view will be available.

As shown in FIGS. 2A through FIG. 2C, the wrist watch 10 according to the embodiment is characterized in that the bulb-shaped solar battery element 25 is arranged in the surface 14*a* of the watch face 13. Therefore, the bulb-shaped solar battery elements 25 arranged in the surface 14*a* of the watch face 13 may be used to decorate the watch face.

Any kind of materials such as plastic, metal, an resign may be used for the watch face. As shown in FIG. 1C, the wrist watch 10 according to the embodiment is characterized in that the box-like member 18A is provided in the surface 14*a* of the watch face 13, the side walls 18*a* and the bottom plate 18*b* of which member are subjected to the light-reflection process, and the bulb-shaped solar battery element 25 is received in the box-like member 18A. Therefore, the incident light to the box-like member 18A is reflected on the side walls 18*a* and the bottom plate 18*b* toward the bulb-shaped solar battery element 25 to be received thereby. The bulb-shaped solar battery element 25 can efficiently receive light to generate electricity.

In the light-reflection process, the inner surface of the box-like member may be processed so as to have figuration suitable for reflecting the light or may be attached with a light reflecting film thereon.

As shown in FIGS. 3A through FIG. 3C, the wrist watch 10 according to the embodiment is characterized in that the bulb-shaped solar battery element 25 is received in the space defined by the rear surface 15*a* of the corner member 6, the top surface 14*a* of the watch face 13, and the inner surface 11*c* of the casing 1.

When the corner member 6 is made of a non or semi light-transmittance material, the bulb-shaped solar battery element 25 mounted on the surface 14*a* of the watch face 13 can be hidden, and a wrist watch of an improved design will be available.

The corner member is subjected to the deposition process to form the semi light-transmittance and light reflection plane on its surface. In other words, material such as silver, aluminum, and/or silicon is deposited against a surface of a transparent base material plate to form a thin light-reflection film thereon. The thin film formed on the surface of the corner member allows a part of the incident light to pass through it, when such thin film has a certain thickness.

As shown in FIG. 3C and FIG. 3D, the wrist watch 10 according to the embodiment is characterized in that either of the surface 14*a* of the watch face 13, the rear surface 15*a* of the corner member 6 and the inner surface 11*c* of the casing 1 is provided with a light reflection layer 30*a*. The incident light to the light reflection layer is reflected on its surface toward the bulb-shaped solar battery element to be received thereby. Therefore, the bulb-shaped solar battery element can efficiently receive the light to generate electricity.

The surface of the watch face, the rear surface of the corner member and the inner surface of the casing may be subjected to the light reflection process similar to the process for the box-like member.

As shown in FIG. 2D, the wrist watch 10 according to the embodiment is characterized in that the corner member 6 is made of a semi light-transmittance material.

The incident light to the corner member is reflected on its surface toward the bulb-shaped solar battery element to be received thereby. Therefore, the bulb-shaped solar battery element can efficiently receive the light to generate electricity.

As shown in FIGS. 4A through FIG. 4D, the wrist watch 10 according to the embodiment is characterized in that the bezel 3 of the casing 1 is formed with the groove 11*b*, and the bulb-shaped solar battery elements 25 are installed in the groove 11*b*, and the groove 11*b* is covered with the cover 11*c* of a light-transmittance member.

In the embodiment, the casing is decorated with the bulb-shaped solar battery elements received in the groove of the casing and the wrist watch which is more attractive in its design is available. The bulb-shaped solar battery element 25 can be easily installed on the bezel because of its unique figure.

As shown in FIG. 4C, the wrist watch 10 according to the embodiment is characterized in that the internal surface (the side walls 11*b*1 and the bottom 11*b*2) of the groove 11*b*1 is subjected to the light-reflection process. Therefore, the incident light to the groove is reflected on the internal surface toward the bulb-shaped solar battery element to be received thereby. The bulb-shaped solar battery element 25 can efficiently receive the light to generate electricity. The surface of the groove may be subjected to the light reflection process similar to the process for the box-like member.

As shown in FIG. 5, the wrist watch 10 according to the embodiment is characterized in that the watch face 13 is made of a light transmittance material, and the supporting plate 19A is provided in the casing1 beneath the watch face 13 for supporting the bulb-shaped solar battery elements 25. The bulb-shaped solar battery elements 25 are arranged between the rear surface 14*b* of the watch face 13 and a top surface 19*a* of the supporting plate 19A. In this embodiment, a lot of bulb-shaped solar battery elements can be received in a comparatively wide space defined between the rear surface of the watch face of a transparent material and the top surface of the supporting plate provided beneath the watch face, and therefore sufficient electric power can be supplied to the wrist watch from these plural battery elements. The watch face is made of a semi light transmittance and light reflection material can hide the bulb-shaped solar battery elements mounted beneath the watch face to allow an improved design of the wrist watch.

As shown in FIG. 5C, the wrist watch 10 according to the embodiment is characterized in that the surface 19*a* of the supporting plate 19A is subjected to the light reflection process.

In this embodiment, the incident light to supporting plate is reflected on its surface toward the bulb-shaped solar battery elements to be received thereby. The bulb-shaped solar battery element can efficiently receive the light to generate electricity.

The surface of the supporting plate may be subjected to the light reflection process similar to the process for the box-like member.

As shown in FIG. 5D, the wrist watch 10 according to the embodiment is characterized in that the supporting plate 19A is made of a semi light-transmittance and light-reflection member, and on a rear surface of the supporting plate 19A may be provided an electro-luminescence element 20A, which is driven and emits light by a current for driving the time counting module 5.

The supporting plate may be subjected to the semi light transmittance and light reflection process similar to the process for the corner member. A part of the light emitted by the electro-luminescence element is allowed to pass through the supporting plate toward the bulb-shaped solar battery element to be received thereby. Receiving the light from the electro-luminescence element, the bulb-shaped solar battery element generates the electricity more efficiently.

Fifth Embodiment

Now referring to FIG. 7, a fifth embodiment will be described in which the present invention is applied to an electronic wrist watch.

Figure 7:
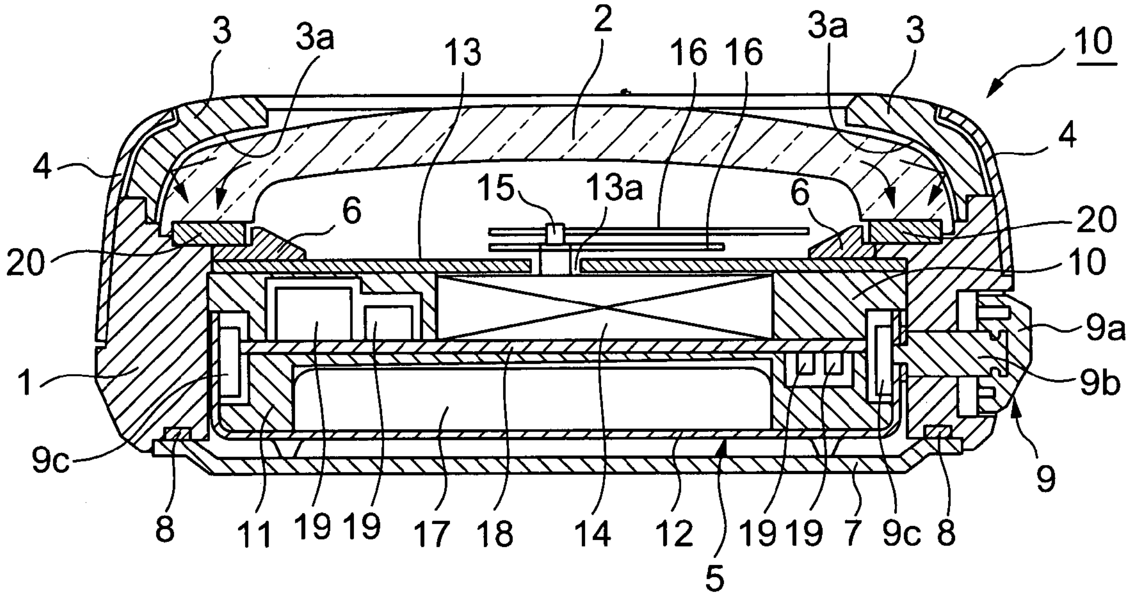
FIG. 7 is an enlarged view of a fifth embodiment in which the invention is used in an electronic wrist watch.

FIG. 7 is an enlarged view of the fifth embodiment in which the invention is used in the electronic wrist watch. The electronic wrist watch has a casing 1 as shown in FIG. 7. The casing 1 is provided on its top side with a watch glass 2 of a light transmittance, a bezel 3, and a decoration member 4. A time counting module 5 facing the watch glass 2 and a ring-shaped corner member 6 are mounted in the casing 1. The casing 1 has on its bottom side a rear cover 7 fixed thereto via a waterproof ring 8, and further has a push button switch 9 on its side wall.

The time counting module 5 has a configuration including an analog process function. The time counting module 5 includes an upper housing 10 and a lower housing 11, both of which are fixed to each other by a base plate 12 attached to a bottom of the lower housing 10. The time counting module 5 of the abovementioned structure is received within the casing 1. On the upper housing 10 of the time counting 5 is disposed a watch face 13, and further on the watch face 13 is provided the corner member 6.

The upper housing 10 contains an analog movement 14. The analog movement 14 has an axis and pointers or hands 16 such as an hour hand and a minute hand. The axis 15 penetrates through a hole 13*a* formed in the watch face 13, and the hour hand and the minute hand are fixed to an end of the axis 13 penetrating through the watch face 13. The hour and minute hand go around above the watch face 13 to indicate the hour. The pointers 16 of the time counting module 5 together with the watch face 13 construct an indicating section of the wrist watch.

Further, the lower housing 11 of the time counting module 5 contains a battery 17. A circuit board 18 is supported between the upper housing 10 and the lower housing 11. On the circuit board 18 are mounted various electronic parts 19 required for counting a time, and are provided a switching section 9*c* of the push button switch 9. The analog movement 14 and the battery 17 are electrically connected to the circuit board 18. The push button switch 9 is constructed such that when a button 9*a* is depressed, a switch axis 9*b* penetrates inside the casing 1 to push the switch section 9*c*.

The watch glass 2 has a center portion which slightly goes upwardly to form a generally anastatic shape and has a peripheral portion which is bent vertically to the watch face 13, as seen in a cross section view of FIG. 7. The watch glass 2 is held with the peripheral portion supported on a solar battery 20 mounted on an upper portion of the casing 2. When the watch glass 2 of the above figure receives the light, a part of the light is allowed to transmit through the watch glass 2, and other part of the light is guided in the watch glass 2 to its peripheral edge to be efficiently received by the solar battery 20. The bezel 3 is mounted on the peripheral portion and has a light reflection plane 3*a* facing the watch glass 2. Further, the watch glass 2 is secured to the casing 1by the bezel 3 and the decoration member 4.

The solar battery 20 is of a construction including a base material such as an insulation film and a solar battery element of amorphous silicon stacked on the base material. It is preferable that the solar battery element stacked on the base material is divided into plural elements. More specifically, the base material of the solar battery 20 is made in a flat and ring configuration which corresponds to the peripheral edge of the watch glass 2,and plural solar battery elements are stacked on the base material. The solar battery 20 of the above structure is received between the casing 1 and the peripheral edge of the watch glass 2, or between a portion including both the casing 1 and the corner member 6 and the peripheral edge of the watch glass 2. The solar battery 20 is electrically connected to the circuit board 18 of the time counting module 5 to supply the electric power thereto.

Since the pointers 16 (the hour hand and the minute hand) advance above the watch face 13 of the above electronic wrist watch, the hour can be read through the watch glass. When the wrist watch is exposed to the light, a part of the incident light to the watch glass 2 transmits through the watch glass 2 to illuminate the pointers 16 and the watch face 13 for easy recognition of the hour and other part of the incident light is guided in the watch glass 2 to its peripheral edge to be received by the solar battery 20.

The wrist watch of the present embodiment can receive the light through the whole surface of the watch glass 2 and a part of the received light is guided in the watch glass 2 to its peripheral edge to irradiate the solar battery 20, and therefore the solar battery 20 can efficiently receive the light to generate the power. Since the watch glass 2 is formed into the generally anastatic shape, the incident light to the watch glass 2 can be taken in the watch glass to be guided to the peripheral edge in an efficient fashion.

Since the bezel 3 mounted on the peripheral portion of the watch glass 2 has the light reflective inner surface 3*a*, the light is prevented from escaping and guided to the peripheral edge along the watch glass 2 bent substantially at a right angle, efficiently reaching to the solar battery 20. Further, since the solar battery 20 can be mounted with the solar battery elements closely contacted with the peripheral edge of the watch glass 2, the solar battery 20 can receive all the light guided to the peripheral edge of the watch glass 2, generating the power efficiently.

In the electronic wrist watch, since the solar battery 20 is mounted facing the peripheral edge of the watch glass 2, the watch face 13 and the pointers 16 arranged within the casing 1 are not restricted in their installation by the solar battery 20, or a wide space may be assured for the watch face 13 and the pointers 16 within the casing 1. Further, since the watch glass 2 has the peripheral edge bent vertically to the watch face 13, and the solar battery 20 is mounted directly under the peripheral edge of the watch glass 2, the casing 1 can be made comparatively small in size and a compact size wrist watch may be available.

Sixth Embodiment

A sixth embodiment in which the present invention is applied to an electronic wrist watch will be set forth with reference to FIG. 8. In the following detailed description, like reference numerals will be used to refer to like or corresponding elements in the fifth embodiment shown in FIG. 7. The electronic wrist watch 24 has a construction substantially similar to the fifth embodiment except a construction of a solar battery 24 used therein and the structure for mounting the battery on the watch.

Figure 8:
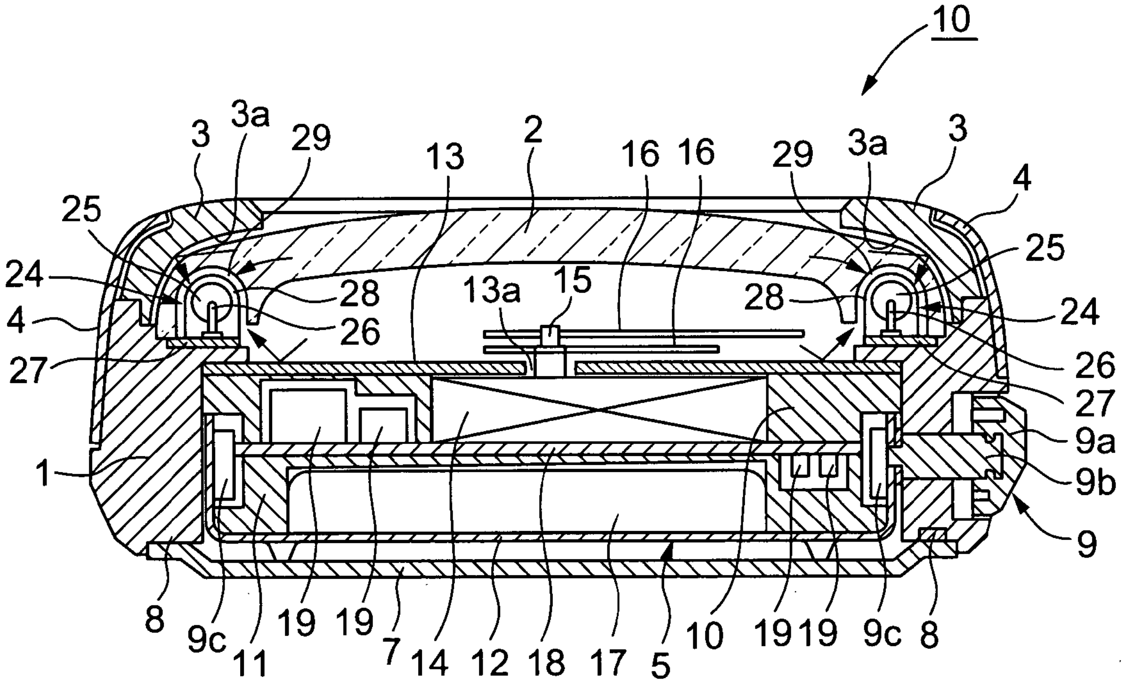
FIG. 8 is an enlarged view of a sixth embodiment in which the invention is used in an electronic wrist watch.

As shown in FIG. 8, the solar battery 24 has a bulb-shaped solar battery element 25. Plural bulb-shaped solar battery elements 25 are arranged under and along the peripheral edge of the watch glass 2. The bulb-shaped solar battery element 25 comprises a p-type polycrystalline or amorphous silicon block with an n-type silicon layer formed on its surface except a portion. Both an exposed portion of the p-type silicon block and the n-type silicon layer are connected to a base board 27 via connecting members 26. The bulb-shaped solar battery elements 25 of the above structure are covered with a transparent covering member 28.

The peripheral edge of the watch glass 2 is formed with a groove 29. The solar battery 24 including the bulb-shaped solar battery elements 25 is mounted on the top plane of the casing 1, and is covered with the watch glass 2. With the above construction, the plural bulb-shaped solar battery elements of the solar battery 24 are retained in the groove 29 formed along the peripheral edge of the watch glass 2. The solar battery 24 is also connected to the circuit board 18 of the time counting module 5. The electronic wrist watch with no corner member 6 on the watch face 13 allows the solar battery 25 to receive the light reflected on the watch face 13.

Similarly to the fifth embodiment, when the electronic wrist watch of the sixth embodiment is exposed to the light, a part of the incident light to the watch glass 2 transmits through the watch glass 2 to illuminate the pointers 16 (the hour hand and the minute hand) and the watch face 13, allowing easy recognition of the hour, and other part of the incident light is guided in the watch glass 2 to its peripheral edge to be emitted to the solar battery 24.

Further, in the similar manner to the fifth embodiment, the electronic wrist watch of the sixth embodiment can receive the light through the whole surface of the watch glass 2 and a part of the received light is guided in the watch glass 2 to its peripheral edge to irradiate the solar battery 24, and therefore the solar battery 24 can efficiently receive the light to generate the power. The light transmitted through the watch glass 2 reflects on the watch face 13 toward the solar battery 24, allowing the same to generate the electric power in a more efficient fashion.

Since the solar battery element of the solar battery 24 is of a bulb shape, a wider surface which is effective for generating the electric power may be used. Further, since the plural solar battery elements 25 are arranged along the peripheral edge of the watch glass 2, the solar battery 24 may efficiently generate the electric power. Since the plural solar battery elements 25, which are arranged in a groove 29 formed along the peripheral edge of the watch glass 2, may equally receive the light guided in the watch glass 2, the solar battery 24 may efficiently generate the electric power.

In the electronic wrist watch according to the sixth embodiment, since the solar battery 24 is arranged in the groove 29 formed along the peripheral edge of the watch glass 2, the watch face 13 and the pointers 16 held within the casing 1 are not restricted in their installation by the solar battery 24, or a wide space may be assured for the watch face 13 and the pointers 16 within the casing 1. Further, since the solar battery 24 is held within the groove 29 formed in the peripheral edge of the watch glass 2, the casing 1 can be made comparatively thin, and therefore a thin and compact size wrist watch may be available.

Seventh Embodiment

Figure 9:
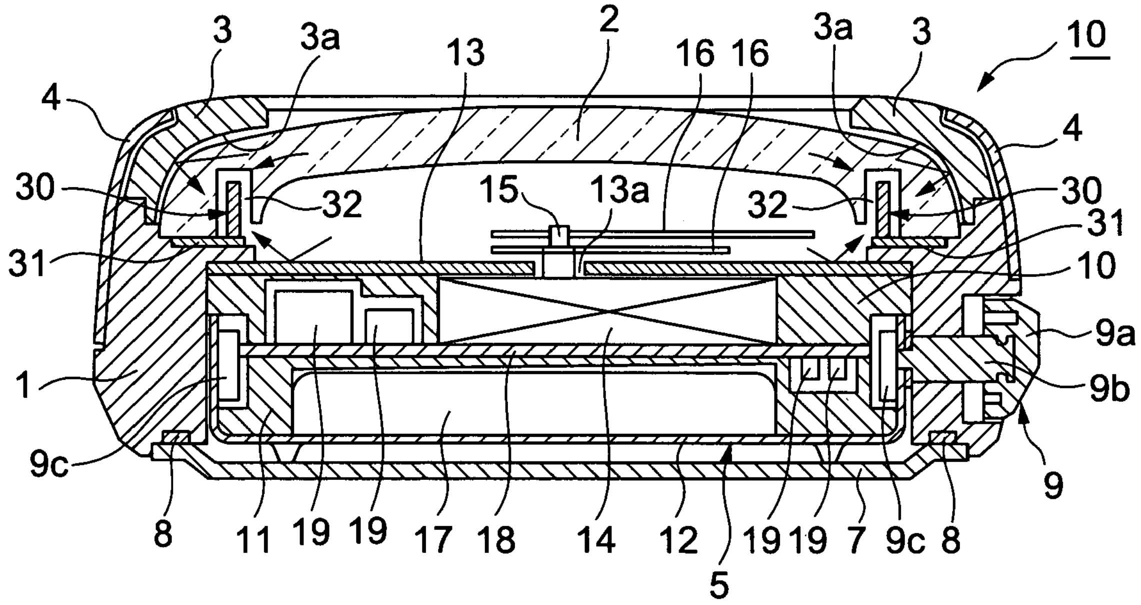
FIG. 9 is an enlarged view of a seventh embodiment in which the invention is used in an electronic wrist watch.

A seventh embodiment in which the present invention is applied to an electronic wrist watch will be set forth with reference to FIG. 9. In the following detailed description, like reference numerals will be used to refer to like or corresponding elements in the fifth embodiment shown in FIG. 7. The electronic wrist watch is of a construction substantially similar to the fifth embodiment except a construction of a solar battery 30 used therein and the structure for mounting the battery on the watch. As shown in FIG. 9, the solar battery 30 is comprised of a cylindrical base member, such as an insulating film, having substantially the same diameter as the watch glass 2 and a solar battery element made of amorphous silicon formed on both sides of the cylindrical base member. It is preferable that the solar battery element is divided into plural elements mounted on the cylindrical base member.

The solar battery 30 is mounted on a base plate 31 in the form of a ring with the cylindrical base member fixed onto the base plate 31 and is electrically connected to the base plate 31. The solar battery 30 is received in a groove 32 formed along the peripheral edge of the watch glass 2 and the base plate 31 with the solar battery 30 attached is disposed between the peripheral edge of the watch glass 2 and the top surface of the casing 1. The solar battery 30 is also connected to the circuit board 18 of the time counting module 5. The electronic wrist watch with no corner member 6 on the watch face 13 allows the solar battery 25 to received the light reflected on the watch face 13.

Similarly to the fifth embodiment, when the electronic wrist watch of the seventh embodiment is exposed to the light, a part of the incident light to the watch glass 2 transmits through the watch glass 2 to illuminate the pointers 16 (the hour hand and the minute hand) and the watch face 13, allowing easy recognition of the hour, and other part of the incident light is guided in the watch glass 2 to its peripheral edge of to be received by the solar battery 24.

Further, similarly to the fifth embodiment, the electronic wrist watch of the seventh embodiment can receive the light through the whole surface of watch glass 2 and a part of the received light is guided in the watch glass 2 to its peripheral edge to irradiate the solar battery 30, and therefore the solar battery 30 can efficiently receive the light to generate the power. The light transmitted through the watch glass 2 reflects on the watch face 13 toward the solar battery 30, allowing the same to generate the electric power in a more efficient fashion. Since the solar battery 30 has the cylindrical base member having substantially the same diameter as the watch glass 2 and the plural solar battery elements formed on both sides of the cylindrical base member, a wider effective surface is available for receiving the light than the solar battery 20 of the fifth embodiment.

Since the plural solar battery elements of the solar battery 30, which are arranged in the groove 32 formed in the peripheral edge of the watch glass 2, may equally receive the light guided in the watch glass 2, the solar battery 30 may efficiently generate the electric power. In the electronic wrist watch according to the seventh embodiment, since the solar battery 30 is received in the groove 32 formed in the peripheral edge of the watch glass 2, the watch face 13 and the pointers 16 held within the casing 1 are not restricted in their installation by the solar battery 30, or a wide space may be assured for the watch face 13 and the pointers 16 within the casing 1. Further, since the solar battery 30 is held within the groove 32 formed in the peripheral edge of the watch glass 2, the casing 1 can be made comparatively thin, and therefore a thin and compact size wrist watch may be available.

In the fifth through seventh embodiments, the analog wrist watches with the time counting module 5 including the analog movement 14 have been described, but a flat-type display element such as a liquid crystal display element and an electro-luminescence element (EL element) may be used in place of the analog movement 14 for the digital wrist watch. In this type of the digital wrist watch, a time counting module including the flat-type display element is disposed within the casing 1 so as to face the watch glace 2. The flat-type display element indicates data such as the hour in an electro-optical manner, and the data can be seen through the watch glass 2. The wrist watch with the flat-type display element will provide advantages similar to those brought by the fifth through seventh embodiments.

Eighth Embodiment

A eighth embodiment in which the present invention is applied to an electronic wrist watch will be set forth with reference to FIG. 10. In the following detailed description, like reference numerals will be used to refer to like or corresponding elements in the fifth embodiment shown in FIG. 7. The electronic wrist watch is of a construction substantially similar to the fifth embodiment except a watch face 35 made having a light guiding nature and a solar battery 36 arrange around a peripheral edge of the watch face 35.

The watch face 35 is made of a transparent glass plate or a transparent synthetic resign plate. The watch face 35 has a reflection layer 35*a* on its bottom surface. When the wrist watch is exposed to the light, the incident light from the top surface of the watch face 35 reflects on the reflection layer 35*a* and a part of the reflected light is guided toward a peripheral edge of the watch face to be radiated therefrom. The watch face 35 is formed with a through hole 35 at its central portion, through which a pointer shaft 15 penetrates.

Similarly to the solar battery 24 in the sixth embodiment, the solar battery 36 includes plural bulb-shaped solar battery elements 37, which are arranged along the peripheral edge of the watch face 35. The bulb-shaped solar battery elements 37 are covered with a transparent covering member 39. Each bulb-shaped solar battery element 37 has a silicon block covered with a silicon layer, the silicon block and the silicon layer being connected with connecting members 38 respectively. The solar battery 36 is disposed on the time counting module 5 within an upper housing 10, with its plural bulb-shaped solar battery elements 35 arranged along the peripheral edge of the watch face 35. The solar battery 36 is electrically connected to circuit board 18 of the time counting module 5.

The solar battery 36 is provided with a cylindrical reflection member 40 so as to surround the plural bulb-shaped solar battery elements 37. The cylindrical reflection member 40 serves to reflect again toward the solar battery elements 37 the light passing through between the solar battery elements 37. The solar battery 36 is hidden by the corner member 6 mounted on the peripheral portion of the watch face 35. A watch glass 41 is mounted on the top of the casing 1 and is attached with a bezel 42 for decoration on its peripheral portion. The external light is received through the watch glass 41 by the solar battery 36 held within the casing 1.

In the wrist watch according to the eighth embodiment, the external light is received through the watch glass 41 to illuminate the pointers 16 and the watch face 35 for easy recognition of the hour. The light illuminating the watch face 35 is reflected on the reflection layer 35*a* of the watch face 35, and a part of the reflected light illuminates the pointers and the watch face 35 again and other part of the reflected light is guided in the watch face toward the peripheral edge to irradiate the solar battery 36.

The electronic wrist watch of the eighth embodiment can receive the light through the whole surface of the watch face 35 and a part of the received light is guided in the watch face 35 to its peripheral edge to irradiate the solar battery 36, and therefore the solar battery 36 can efficiently receive the light to generate the power. Since the solar battery element 37 of the solar battery 36 is of a bulb shape, a wider surface which is effective for generating the electric power may be used. Further, since the plural solar battery elements 37 are arranged along the peripheral edge of the watch face 35, the solar battery 36 may efficiently generate the electric power.

The solar battery 36 is provided with the cylindrical reflection member 40 surrounding the plural bulb-shaped solar battery elements 37, and the cylindrical reflection member 40 serves to reflect again toward the solar battery elements 37 the light passing through between the solar battery elements 37. The light irradiated from the peripheral edge of the watch face 35 equally illuminates all the solar battery elements, and therefore the solar battery 36 can efficiently receive the light to generate the electric power. Further, since the solar battery elements of the solar battery 36 is arranged along the peripheral edge of the watch face 35, the solar battery does not restrict a space for the watch face 35 and the pointers 16. As a result, a wider space can be used for the watch face 35 and the pointers 16 and a thin and compact size wrist watch may be available.

Ninth Embodiment

A ninth embodiment in which the present invention is applied to an electronic wrist watch will be set forth with reference to FIG. 11. In the following detailed description, like reference numerals will be used to refer to like or corresponding elements in the eighth embodiment shown in FIG. 10. The electronic wrist watch is of a construction substantially similar to the eighth embodiment except a construction of a solar battery 45 and a structure for mounting the battery on the watch.

Figure 11:
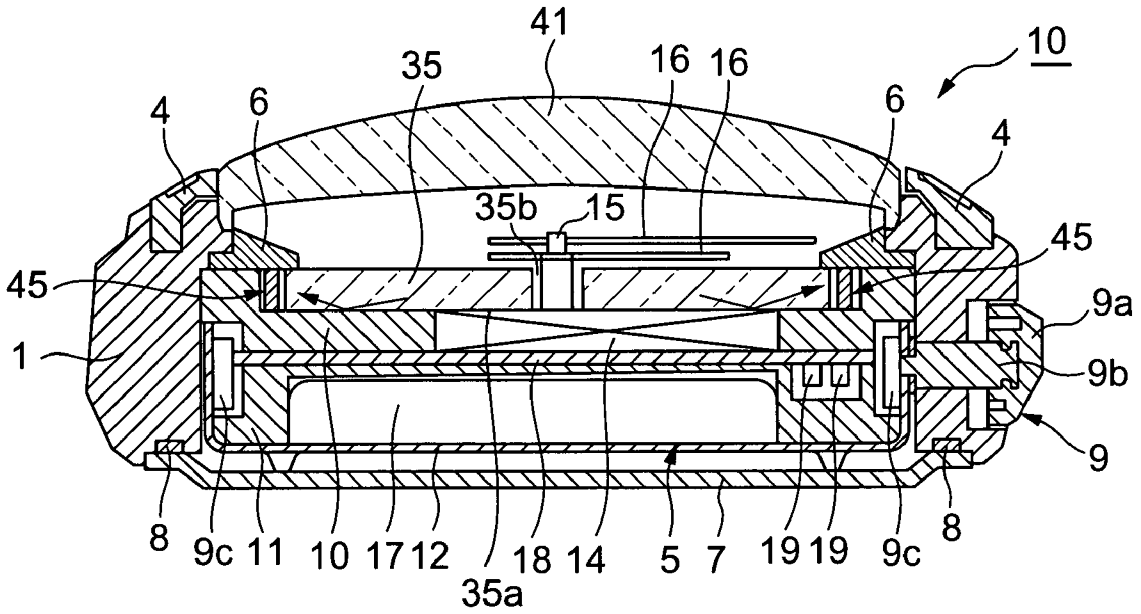
FIG. 11 is an enlarged view of a ninth embodiment in which the invention is used in an electronic wrist watch.

As shown in FIG. 11, the solar battery 45 comprises a cylindrical base member, such as an insulating film, having a diameter a little larger than the watch face 35 and a solar battery element made of amorphous silicon formed on an inner surface of the cylindrical base member. It is preferable that the solar battery element is divided into plural elements mounted on the inner surface of the cylindrical base member. The solar battery 45 is arranged within the upper housing 10 with the base member mounted on the time counting module 5, and with the plural solar battery elements facing the peripheral edge of the watch face or digital face 35. The solar battery 45 is hidden by the corner member 6 mounted on the peripheral portion of the watch face 35.

In the wrist watch according to the ninth embodiment, the external light is received through the watch glass 41 to illuminate the pointers 16 and the watch face 35 for easy recognition of the hour. The light illuminating the watch face 35 is reflected on the reflection layer 35*a* of the watch face 35, and a part of the reflected light illuminates the pointers and the watch face 35 again and other part of the reflected light is guided in the watch face toward the peripheral edge to irradiate the solar battery 45.

The electronic wrist watch according to the ninth embodiment can receive the light through the whole surface of the watch face 35 and a part of the received light is guided in the watch face 35 toward its peripheral edge to irradiate the solar battery 45, and therefore the solar battery 45 can efficiently receive the light to generate the power. The solar battery 45 is of a substantially cylindrical structure, and when it is mounted on the upper housing 10, the plural solar battery elements 37 can be arranged close to the peripheral edge of the watch face 35. This arrangement allows the solar battery 45 to receive the light irradiated from the peripheral edge of the watch face 35 without wasting the light.

Further, since the solar battery elements of the solar battery 45 is arranged along the peripheral edge of the watch face 35, the solar battery 45 does not restrict a space for the watch face 35 and the pointers 16. As a result, a wider space can be used for the watch face 35 and the pointers 16 and a thin and compact size wrist watch may be available.

In the eighth and ninth embodiments, the analog wrist watches with the time counting module 5 including the analog movement 14 have been described, but a flat-type display element such as a liquid crystal display element and an electro-luminescence element (EL element) may be used in place of the analog movement 14 for the digital wrist watch. In this type of the digital wrist watch, a time counting module including the flat-type display element is disposed within the casing 1 so as to face the watch glace 2. The flat-type display element indicates data such as the hour in an electro-optical manner, and the data can be seen through the watch glass 2. Further, it is recommended to attach to the flat-type display element a light guiding member which guides the light to the solar battery for generating the electric power more efficiently. The wrist watch with the solar battery arranged facing the peripheral edge of the light guiding member will provide advantages similar to those brought by the fifth and eighth embodiments.

In the above fifth through ninth embodiments and their modifications, the wrist watches to which the present invention is applied have been described, but it should be noted that the present invention will be used in a wide variety of fields, for instance, including time pieces such as a traveler's watch and a clock, an electronic calculator, an electronic notebook, an electronic dictionary, a cellular phone, and various meters for an automobile.

As shown in FIGS. 7 through FIG. 9, the wrist watches according to the embodiments each comprise the casing 1 containing the display section including the watch face 13 and the pointers 16, the watch glass 2 or a protection glass of a light transmittance nature, and the solar battery 20, 24, 30, arranged facing the peripheral edge of the protection glass. The protection glass is mounted on the casing 1 so as to face the display section.

When the wrist watch is exposed to the light, the light transmits through the protection glass, illuminating the display section in the casing 1, for easy visual recognition. A part of the incident light is guided in the protection glass toward the peripheral edge to be irradiated to the solar battery, that is, the light can be efficiently received by the battery for generating the electric power. Since the battery is arranged along the peripheral edge of the protection glass, this arrangement of the battery does not give any restriction to the display section.

In the embodiments shown in FIG. 7 through FIG. 9, the protection glass or the watch glass 2 of the wrist watch has the peripheral portion that is bent vertically to the watch face or digital face 35, and the solar battery 20, 24, 30 is disposed closed to the peripheral edge of the watch glass 2.

According to the invention, the protection glass has the peripheral portion bent vertically to the watch face, and therefore the solar battery can be disposed facing the peripheral edge of the protection glass so that a casing or an apparatus of a compact size is available.

In the embodiments shown in FIGS. 7 through FIG. 9, the protection glass or the watch glass 2 of the wrist watch has the bezel 3 secured on its bent portion, and the bezel 3 has a reflection plate 3a on its inner surface.

The light guided in the protection glass toward the peripheral edge is prevented from escaping from the vertically bent portion of the protection glass, and therefore the light is effectively guided in the protection glass.

As shown in FIG. 7, the solar battery 20 used in the embodiment comprises plural solar battery elements arranged on top of the base member in the form of a ring. In the embodiment, the solar battery is disposed in the casing with the plural solar battery elements on the base member arranged closely on the peripheral edge of the protection glass, and therefore the light guided in the watch glass toward the peripheral edge may be irradiated directly to the solar battery, allowing the solar battery to generate the electric power more efficiently.

As shown in FIG. 8, the solar battery 24 used in the embodiment comprises the plural bulb-shaped solar battery elements 25 arranged on the peripheral edge of the watch glass 2 or the protection glass. The bulb-shaped solar battery element is of a bulb shape so that it can use a wider surface for receiving the light. The plural bulb-shaped battery elements of the solar battery are arranged closely on the peripheral edge of the protection glass, allowing the solar battery to more efficiently generate the electric power. Further, as shown in FIG. 8, the solar battery is received in the groove 29 formed along the peripheral edge of the protection glass, and therefore the light guided in the protection glass irradiates the whole periphery surface of the bulb-shaped solar battery element, allowing the solar battery to generate the electric power efficiently.

As shown in FIG. 9, the solar battery 30 used in the embodiment comprises a cylindrical base member and a solar battery element(s) attached on one of the surfaces of the cylindrical base member. The solar battery of this structure is received in the groove 32 formed along the peripheral edge of the protection glass.

Since the solar battery element(s) is received in the groove 32 formed along the peripheral edge of the protection glass, the light guided in the protection glass equally illuminates the solar battery element(s). If the solar battery elements are attached on both surfaces of the cylindrical base member, the wider surface will be used for receiving the light and the direct incident light as well as the light guided along the protection glass can be received. The solar battery with the battery elements attached on the both surfaces of the base member can receive the light and generate the electric power efficiently.

Figure 10:
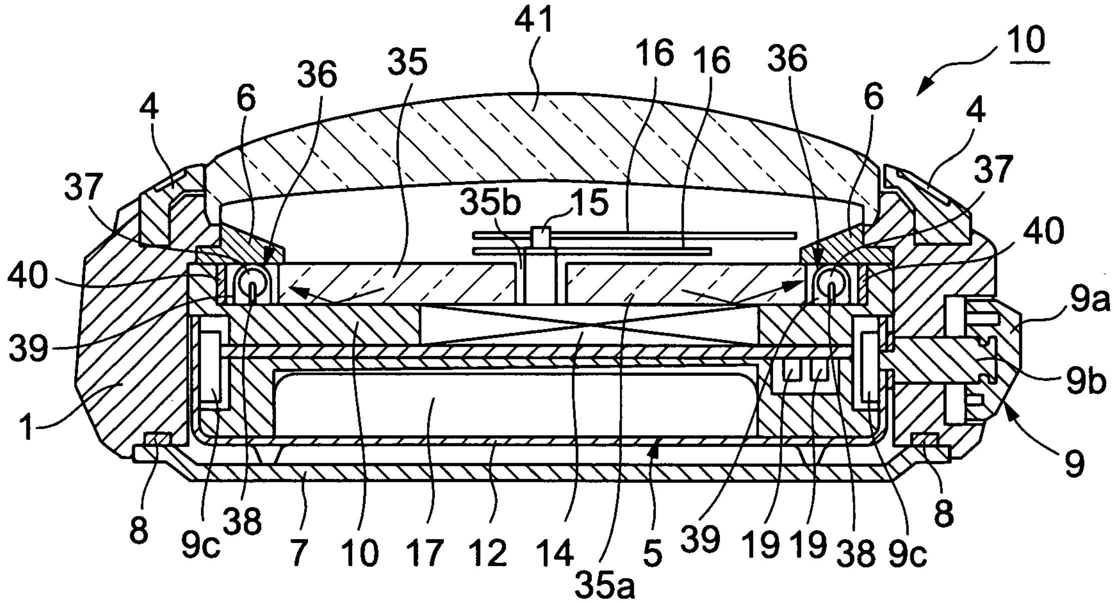
FIG. 10 is an enlarged view of an eighth embodiment in which the invention is used in an electronic wrist watch.

As shown in FIG. 10 and FIG. 11, the wrist watches according to the embodiments each comprise the casing 1 with a window or the watch glass 41, a display member or the watch face 35 of a light transmittance nature, and the solar battery 36, 45, arranged facing the peripheral edge of the window. The display member is mounted on the casing 1 so as to face the window. When the wrist watch is exposed to the light, the light transmits through the display member, illuminating the display member in the casing 1, for easy visual recognition.

A part of the incident light is guided in the display member toward the peripheral edge to be irradiated to the solar battery, that is, the light can be efficiently received by the battery for generating the electric power. Since the battery is arranged along the peripheral edge of the display member, this arrangement of the battery does not give any restriction to the display member.

As shown in FIG. 10, the solar battery 36 used in the embodiment comprises the plural bulb-shaped solar battery elements 37 arranged on the peripheral edge of the watch face 35 or a display member.

The bulb-shaped solar battery element is of a bulb shape so that it can use a wider surface for receiving the light. The plural bulb-shaped battery elements of the solar battery are arranged closely on the peripheral edge of the display member, allowing the solar battery to generate the electric power more efficiently. Further, as shown in FIG. 10, the solar battery is provided with the cylindrical reflection member so as to surround the plural bulb-shaped solar battery elements. This cylindrical reflection member serves to reflect toward the solar battery elements the light passing through between the solar battery elements to equally irradiate the whole periphery surface of the bulb-shaped solar battery elements, allowing the solar battery to generate the electric power efficiently.

In the embodiment shown in FIG. 11, the solar battery 45 is comprised of the cylindrical base member and solar battery elements attached on the inner surface of the cylindrical base member. The solar battery is mounted in the casing with the plural solar battery elements facing the peripheral edge of the display member or the watch face.

The solar battery is of a substantially cylindrical structure with plural solar battery elements attached on its inner surface, and the plural solar battery elements can be disposed close to the peripheral edge of the display member. This arrangement allows the solar battery to receive the light irradiated from the peripheral edge of the display member without wasting the light. Further modification and variation can be made to the disclosed embodiments without departing from the subject and spirit of the invention as defined in the following claims. Such modification and variations, as included within the scope of these claims, are meant to be considered part of the invention as described.

What is claimed is:

1. A timepiece comprising:

a casing with a bezel;

a face that is provided within the casing and made of an optically transparent material;

a timepiece module provided within the casing;

a plurality of bulb-shaped semiconductor elements as a drive source for the timepiece module; and a supporting member, which is provided at a rear side of the face, and which supports the semiconductor elements between the face and the supporting member.

2. The timepiece of claim 1, wherein the supporting member comprises a light reflective layer on a surface thereof that supports the semiconductor elements.

3. The timepiece of claim 1, wherein the supporting member is made of a semi-light transparent and reflective material; and wherein the timepiece further comprises an electro-luminescence element, which is provided on a rear surface of the supporting member, and which becomes luminescent by an electric field due to a flowing current from the plurality of semiconductor elements.

* * * * *

UNITED STATES PATENT AND TRADEMARK OFFICE

CERTIFICATE OF CORRECTION

PATENT NO. : 7,079,453 B2
APPLICATION NO. : 10/602363
DATED : July 18, 2006
INVENTOR(S) : Shunji Minami It is certified that error appears in the above-identified patent and that said Letters Patent is hereby corrected as shown below:

On the Title page:

Under item (75) Inventors, delete “Makoto Sawada”.

Signed and Sealed this

Sixteenth Day of September, 2008

JON W. DUDAS
*Director of the United States Patent and Trademark Office*